(12) United States Patent
Murata

(10) Patent No.: US 7,409,190 B2
(45) Date of Patent: Aug. 5, 2008

(54) RADIO-FREQUENCY CIRCUIT MODULE AND RADIO COMMUNICATION APPARATUS

(75) Inventor: Ryuji Murata, Nakamuroda Haruna-Machi (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 419 days.

(21) Appl. No.: 11/115,483

(22) Filed: Apr. 27, 2005

(65) Prior Publication Data
US 2005/0272399 A1    Dec. 8, 2005

(30) Foreign Application Priority Data
Apr. 30, 2004   (JP) .............................. 2004-135745

(51) Int. Cl.
*H04B 1/40*   (2006.01)
(52) U.S. Cl. ................ 455/76; 455/318; 455/333; 361/814
(58) Field of Classification Search ............ 455/76, 455/550.1, 128, 255, 259, 300, 318, 319, 455/333; 361/736, 748, 814, 816; 331/18
See application file for complete search history.

(56) References Cited

U.S. PATENT DOCUMENTS 6,628,925 B1 *  9/2003  Ishida et al. ................. 455/73

2005/0030231 A1 *  2/2005  Nagaishi et al. ......... 343/700 MS

FOREIGN PATENT DOCUMENTS

| JP | 7-99411 | 4/1995 |
|---|---|---|
| JP | 07-099441 | 4/1995 |
| JP | 10-135756 | 5/1998 |
| JP | 2001-189417 A | 7/2001 |
| JP | 2001-308640 A | 11/2001 |
| JP | 2002-9225 | 1/2002 |
| JP | 2002-009225 A | 1/2002 |
| JP | 2002-261235 A | 9/2002 |
| JP | 2002-290202 A | 10/2002 |
| JP | 2002-359327 A | 12/2002 |
| JP | 2003-100989 A | 4/2003 |
| WO | WO 03/085739 A1 | 10/2003 |

* cited by examiner

*Primary Examiner*—Nguyen Vo
(74) *Attorney, Agent, or Firm*—Knobbe Martens Olson & Bear LLP (57) ABSTRACT

An integrated-circuit element and passive components are mounted on a front face of a multilayer substrate. A capacitor constituting a crystal-oscillator circuit is disposed inside the multilayer substrate. A cavity is provided in a rear face of the multilayer substrate. A crystal oscillator constituting the crystal-oscillator circuit is accommodated in the cavity, and the cavity is sealed with a sealing cap made of a conductive material. The sealing cap is fixed to an electrode pad provided on a motherboard with solder therebetween.

18 Claims, 6 Drawing Sheets

RADIO-FREQUENCY CIRCUIT MODULE AND RADIO COMMUNICATION APPARATUS

BACKGROUND OF THE INVENTION

1. Field of the Invention

The present invention generally relates to radio-frequency (RF) circuit modules and radio communication apparatuses, and more particularly, to an RF circuit module and a radio communication apparatus that can be miniaturized.

2. Description of the Related Art

In order to reduce the size of radio communication apparatuses, RF circuit modules in which an RF front end part and a baseband part of a radio communication circuit are modularized have been considered. Such RF circuit modules are designed based on a communication standard, such as Bluetooth™ or a wireless local-area network (LAN), and incorporated into application apparatuses, such as cellular phones or personal computers, to function as modules for providing a radio communication function to the application apparatuses.

From among the RF circuit modules of this type, RF circuit modules in which an RF circuit is integrated with a crystal-oscillator circuit functioning as a reference oscillator of the RF circuit are known. For example, RF circuit modules with the structures described in Japanese Unexamined Patent Application Publication Nos. 10-135756 and 2002-9225 have already been considered.

In addition, for example, a crystal-oscillator circuit described in Japanese Unexamined Patent Application Publication No. 7-99411 is known.

As shown in FIG. 1 of Japanese Unexamined Patent Application Publication No. 10-135756, a structure in which cavities are provided in the front and rear faces of a multilayer substrate, a crystal oscillator and an integrated circuit (IC) are disposed in the cavity in the front face, and a passive component is disposed in the cavity in the rear face is described in Japanese Unexamined Patent Application Publication No. 10-135756. In this structure, since the crystal oscillator and the IC are accommodated in the same cavity, a certain mounting area is required, and it is thus difficult to design a module whose size is close to the chip size of the IC.

As shown in FIG. 1 of Japanese Unexamined Patent Application Publication No. 2002-9225, a structure in which a crystal oscillator, a baseband IC, and a memory IC are disposed on the front face of a multilayer substrate and an RF IC is disposed in a cavity provided in the rear face of the multilayer substrate is described in Japanese Unexamined Patent Application Publication No. 2002-9225. In this structure, since the crystal oscillator and the ICs are disposed on the same face, a certain mounting area is required, as in Japanese Unexamined Patent Application Publication No. 10-135756.

When taking into consideration the fact that single-chip ICs in which an RF circuit block and a baseband circuit block are integrated with each other have been considered and that modules whose size is equivalent to the size of IC chips have been desired in recent years, it is difficult to realize miniaturization with the structures described in Japanese Unexamined Patent Application Publication Nos. 10-135756 and 2002-9225.

As described in Japanese Unexamined Patent Application Publication No. 7-99411, a crystal oscillator circuit includes a crystal oscillator, an inverting amplifier, and a feedback circuit. The crystal oscillator needs to have a mechanical sealing structure, and the inverting amplifier and the feedback circuit are required to be arranged using wiring with the minimum length. Thus, a module structure in which the characteristics of the crystal oscillator circuit can be satisfied and miniaturization can be realized is desired.

SUMMARY OF THE INVENTION

Accordingly, in an aspect, it is an object of the present invention to provide an effective procedure for miniaturizing an RF circuit module including an RF circuit and a crystal oscillator circuit.

In order to achieve the above object, according to an aspect of the present invention, a radio-frequency circuit module includes a radio-frequency circuit, part of which is constituted by a radio-frequency integrated circuit disposed on a front face of a multilayer substrate; and a crystal-oscillator circuit, part of which is constituted by a crystal oscillator disposed in a cavity provided in a rear face of the multilayer substrate.

In an embodiment, an RF circuit includes an RF front end part and a baseband part that constitute a radio communication circuit. An RF IC in which part of the RF circuit is integrated is mounted on a multilayer substrate. Although only the RF front end part or only the baseband (BB) part may be integrated in the RF IC as a circuit block, it is preferable that an RF IC in which both blocks are integrated in the same chip be used. When the RF front end part and the baseband part are arranged as different chips, two chips, that is, the RF IC in which the RF front end part is integrated and a BB IC in which the baseband is integrated, can be disposed together on the front face of the multilayer substrate.

When a circuit for Bluetooth is arranged as an RF circuit, the circuit structure shown in FIG. 2 of Japanese Unexamined Patent Application Publication No. 2002-9225 may be used. When a circuit for a wireless LAN is arranged as an RF circuit, a known circuit structure may be used. Passive elements, such as a filter, an inductor, and a capacitor, constituting the RF circuit may be integrated into the RF IC, disposed inside the multilayer substrate, or mounted as components on the front face of the multilayer substrate.

In an embodiment, the crystal-oscillator circuit is used as a reference oscillator of the RF circuit. The crystal-oscillator circuit may include an oscillation semiconductor including a complementary metal-oxide semiconductor (C-MOS) inverter, a crystal oscillator, and a capacitor for determining an oscillating frequency. The crystal-oscillator circuit generates a clock signal at a predetermined frequency by a resonant operation of the crystal oscillator, and inputs the clock signal to the RF circuit. The crystal-oscillator circuit may have the structure described in Japanese Unexamined Patent Application Publication No. 7-99411.

In an embodiment, the multilayer substrate is an element for realizing part of the wiring in the RF circuit, part of the wiring in the crystal-oscillator circuit, or a connection between the RF circuit and the crystal-oscillator circuit. The multilayer substrate may be ceramic or resin. If a ceramic substrate is used, for example, a wiring pattern is formed by applying a conductive material, such as silver or gold, to a substrate made of a low-temperature fired material, and after laminating a plurality of substrates formed as described above, the plurality of laminated substrates is baked at 900° C. to 1000° C. Accordingly, a multilayer substrate is formed.

In an embodiment, a cavity having a predetermined shape is provided in the rear face of the multilayer substrate. The crystal oscillator is accommodated in the cavity. Since a wall surface of the cavity covers the crystal oscillator, packaging for sealing the crystal oscillator is not needed. In addition, since the crystal oscillator and the RF IC can be disposed so as to overlap each other, even if the area of the RF IC is large, a module whose size is equivalent to the chip size can be provided.

According to another aspect of the present invention, a radio-frequency circuit module includes a radio-frequency circuit; and a crystal-oscillator circuit, part of which is constituted by a crystal oscillator disposed in a cavity provided in a rear face of a multilayer substrate. A signal processing section of the radio-frequency circuit and an adjusting section of the crystal-oscillator circuit are integrated in a radio-frequency integrated circuit disposed on a front face of the multilayer substrate.

According to the above aspect, by integrating an adjusting section of a crystal-oscillator circuit into an RF IC disposed on the front face of a multilayer substrate and by accommodating a crystal oscillator in a cavity provided in the rear face of the multilayer substrate, the crystal-oscillator circuit using the IC can be adjusted and the mounting area can be reduced.

In an embodiment, a signal processing section of the RF circuit is a circuit block that performs signal processing using a clock signal generated by the crystal-oscillator circuit. By integrating the signal processing section of the RF circuit with part of the crystal-oscillator circuit, the length of wiring between the RF circuit and the crystal-oscillator circuit can be reduced. Thus, a circuit module with excellent oscillation characteristics and reduced noise can be realized. It is preferable that an inverting amplifier of the crystal-oscillator circuit be integrated into the same IC.

According to another aspect of the present invention, a radio-frequency circuit module includes a radio-frequency circuit; a crystal-oscillator circuit, part of which is constituted by a crystal oscillator disposed in a first cavity provided in a rear face of a multilayer substrate; and a memory circuit, which is constituted by a memory element disposed in a second cavity provided in the rear face of the multilayer substrate. A signal processing section of the radio-frequency circuit and an adjusting section of the crystal-oscillator circuit are integrated in a radio-frequency integrated circuit disposed on a front face of the multilayer substrate.

In an embodiment, a memory circuit may form a storage area in which software for signal processing and various types of setting data are stored, using an EEPROM, as shown in FIG. 2 of Japanese Unexamined Patent Application Publication No. 7-99411.

According to this aspect, since a cavity accommodating a crystal oscillator and a cavity accommodating a memory element are provided separately, a crystal oscillator can be easily sealed and a rear region of a multilayer substrate can be effectively used. Thus, miniaturization equivalent to an RF IC, which may be the largest element, can be expected. In an embodiment, since the RF IC in which an RF front end part and a baseband part are integrated is larger than the area necessary for sealing the crystal oscillator and for accommodating an EEPROM, a structure in which the RF IC is disposed on the front face of the multilayer substrate and in which the crystal oscillator and the memory element are disposed on the rear face of the multilayer substrate is effective.

According to another aspect of the present invention, a radio-frequency circuit module includes a radio-frequency circuit; and a crystal-oscillator circuit including a crystal oscillator, an inverting amplifier, a variable capacitor, and a fixed capacitor. In an embodiment, the variable capacitor and the fixed capacitor constitute a feedback circuit. The inverting amplifier and the variable capacitor are integrated in a circuit element and disposed on a front face of a multilayer substrate. The fixed capacitor is disposed inside the multilayer substrate. The crystal oscillator is disposed in a cavity provided in a rear face of the multilayer substrate.

As described above, in one or more embodiments, since components of a crystal-oscillator circuit are distributed on the front face, an inner layer, and the rear face, more compact circuit module can be realized. In other words, an inverting amplifier and a variable capacitor for adjustment that can be integrated as an IC is realized as an integrated circuit on the front face, a fixed capacitor for which a large capacitance is required is disposed inside the multilayer substrate, and a crystal oscillator requiring a space for mechanical oscillations and sealing is disposed in a cavity provided in the rear face of the multilayer substrate. Thus, a crystal-oscillator circuit can be realized in and on the multilayer substrate using wiring with the minimum length.

Here, it is preferable that the inverting amplifier and the variable capacitor that are disposed on the front face of the multilayer substrate, the fixed capacitor that is disposed inside the multilayer substrate, and the crystal oscillator that is disposed on the rear face of the multilayer substrate be arranged in a linear fashion in the direction of the thickness of the multilayer substrate and that the crystal-oscillator circuit be arranged using wiring with the minimum length.

According to another aspect of the present invention, a radio-frequency circuit module includes a radio-frequency circuit, part of which is constituted by a radio-frequency integrated circuit disposed on a front face of a multilayer substrate; a crystal-oscillator circuit, part of which is constituted by a crystal oscillator disposed in a cavity provided in a rear face of the multilayer substrate; a conductive sealing cap exposed on the rear face of the multilayer substrate, the sealing cap sealing the cavity; and an external terminal exposed on the same face as the face on which the sealing cap is exposed.

As described above, in one or more embodiments, since a sealing cap for sealing a crystal oscillator is made of a conductive material and the sealing cap is exposed on the rear face of a multilayer substrate, the sealing cap can be used as a reinforcing terminal or a ground pattern. Thus, the area in which the crystal is installed can be effectively used. Preferably, the sealing cap is made of an alloy of gold and tin.

According to another aspect of the present invention, a radio communication apparatus includes a radio-frequency circuit module mounted on a motherboard, the radio-frequency circuit module including a radio-frequency circuit, part of which is constituted by a radio-frequency integrated circuit disposed on a front face of a multilayer substrate; a crystal-oscillator circuit, part of which is constituted by a crystal oscillator disposed in a cavity provided in a rear face of the multilayer substrate; a conductive sealing cap exposed on the rear face of the multilayer substrate, the sealing cap sealing the cavity; and an external terminal exposed on the same face as the face on which the sealing cap is exposed. In an embodiment, the radio-frequency circuit module is mounted on the motherboard with the sealing cap and the external terminal therebetween, and the radio-frequency circuit module is electrically connected inside the motherboard with at least the external terminal therebetween.

As described above, in one or more embodiments, since the circuit module and the motherboard are connected to each other with the sealing cap therebetween, the mounting strength of the circuit module increases. In addition, when the sealing cap is used as a ground pattern, reinforcement of the ground pattern can be achieved.

As described above, according to at least one aspect of the present invention, required characteristics of a crystal-oscillator circuit are satisfied, and miniaturization of an RF circuit module can be realized.

In all of the aforesaid embodiments, any element used in an embodiment can interchangeably be used in another embodiment unless such a replacement is not feasible or causes adverse effect. Further, the present invention can equally be applied to apparatuses and methods. In the present specification, the term "connected" means "directly physically connected", "indirectly physically connected", and/or "electrically connected".

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes.

DETAILED DESCRIPTION OF THE PREFERRED EMBODIMENT

An RF circuit module according to embodiments of the present invention will be described with reference to the drawings. The present invention is not limited to the following embodiments, and various changes and modifications can be made to the present invention without departing from the spirit and scope thereof.

Figure 1:
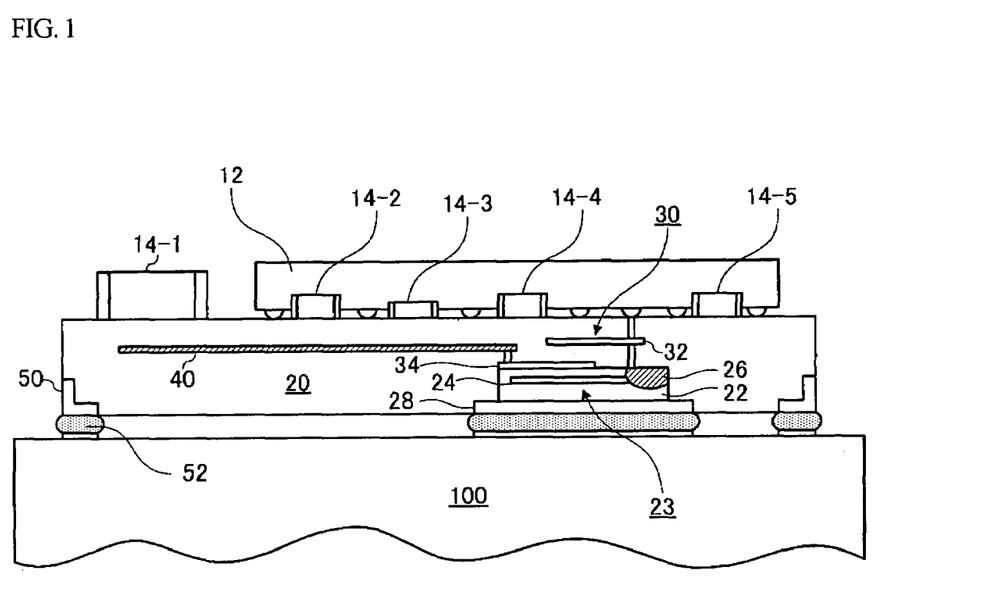
FIG. 1 is a cross-sectional view showing the structure of an RF circuit module according to a first embodiment of the present invention.

FIG. 1 is a cross-sectional view showing the structure of an RF circuit module according to a first embodiment of the present invention. Referring to FIG. 1, in the circuit module, an IC element 12 and passive components 14-1 to 14-5 are disposed on the front face of a multilayer substrate 20, and an inner capacitor 30 is disposed on an inner layer of the multilayer substrate 20, and a cavity 22 is provided in the rear face of the multilayer substrate 20. A crystal strip 24 is fixed in the cavity 22 using an electroconductive adhesive 26. The fixed crystal strip 24 constitutes a crystal oscillator 23.

The IC element 12 is a flip-chip IC in which an RF front end part and a baseband part of an RF circuit and an adjusting part of a crystal-oscillator circuit are integrated with each other. The IC element 12 is connected to an electrode pad (not shown) disposed on the front face of the multilayer substrate 20 via a plurality of bumps. The passive components 14-1 to 14-5 are an antenna, a filter, a capacitor, an inductor, and the like. These passive components 14-1 to 14-5 are connected to the electrode pad disposed on the front face of the multilayer substrate 20 via external electrodes provided on wall surfaces of the passive components.

The multilayer substrate 20 includes a plurality of laminated ceramic wiring boards. The inner capacitor 30, a ground (GND) electrode 40, a power supply line, and various wiring patterns are disposed inside the multilayer substrate 20. The inner capacitor 30 includes an upper capacitor electrode 32 and a lower capacitor electrode 34 disposed above and below a ceramic board and functions as a capacitor element in the crystal-oscillator circuit. The lower capacitor electrode 34 is connected to the GND electrode 40 with a via hole therebetween, and the inner capacitor 30 thus functions as a ground capacitor.

A via hole connecting the IC element 12 and the crystal oscillator 23 is provided in a linear fashion from the IC element 12 to the crystal strip 24 so as to go through the upper capacitor electrode 32. Thus, the crystal-oscillator circuit is arranged using wiring with the minimum length. As described above, providing wiring in a linear fashion from the crystal oscillator 23 to the IC reduces the length of wiring that is arranged in parallel to other wiring. Thus, the stray capacitance is reduced, and the loss of the circuit is also reduced. Accordingly, stable characteristics of the oscillator circuit are ensured.

A sealing cap 28 seals an opening of the cavity 22 so as to fit on the same face as the rear face of the multilayer substrate 20. External terminals 50 disposed at the periphery of the multilayer substrate 20 and the sealing cap 28 are connected to electrode pads disposed on a motherboard 100 with solder 52 therebetween. The sealing cap 28 is made of an alloy of gold and tin.

Figure 2:
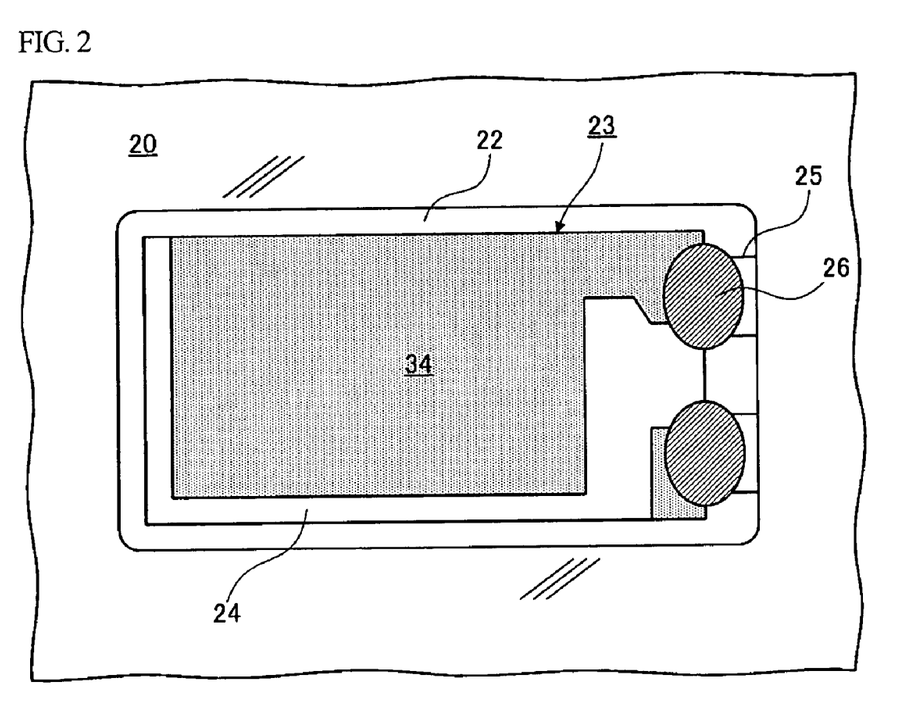
FIG. 2 is an enlarged bottom view showing the planar structure of a crystal oscillator shown in FIG. 1.

FIG. 2 is an enlarged bottom view showing a planar structure of the crystal oscillator 23 shown in FIG. 1. Referring to FIG. 2, the crystal strip 24 is arranged so as to two-dimensionally overlap the lower capacitor electrode 34. One end of the crystal strip 24 is open, and the other end of the crystal strip 24 is connected to a connection pattern 25 via the electroconductive adhesive 26. The connection pattern 25 is an inner pattern protruding from a wall surface of the cavity 22. Fixing the crystal strip 24 to the connection pattern 25 realizes the crystal oscillator 23 having a structure with one side supported.

The via hole for connecting the crystal oscillator 23 and the IC element 12 shown in FIG. 1 is connected to the connection pattern 25. The crystal strip 24 is fixed in a position in the cavity 22 that is a predetermined distance away from the wall surface of the cavity 22, so that the crystal strip 24 can oscillate.

Figure 3A:
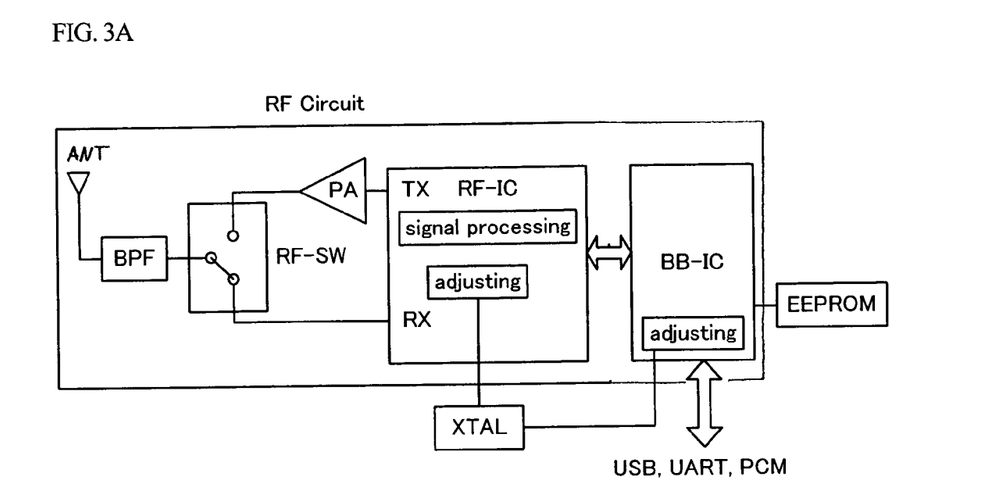
FIGS. 3A-3D are circuit block diagrams each showing structures of radio communication circuits realized by the circuit module shown in FIG. 1.

FIGS. 3A-3D are circuit block diagrams each showing structures of radio communication circuits realized by the circuit module shown in FIG. 1. Referring to FIG. 3A, in the circuit module, a radio communication circuit including an antenna (ANT) transmitting and receiving radio waves, a band-pass filter (BPF) causing radio waves in a predetermined communication band to pass through, an RF switch (RF-SW) switching between a transmission path (TX) and a reception path (RX), a power amplifier (PA) disposed in the transmission path (TX), an RF IC (RF-IC) in which an RF front end part is integrated, a baseband IC (BB-IC) in which a baseband part is integrated, a crystal oscillator (XTAL) generating a clock signal of the BB-IC, and an electrically erasable programmable read-only memory (EEPROM) functioning as a memory element is realized. The EEPROM is not indicated in FIG. 1. The BB-IC is also connectable to conventional I/F standard ports including USB, UART, and PCM.

In FIG. 3A, the ANT, BPF, RF-SW, PA, RF-IC, and BB-IC constitute an RF circuit. Both the RF-IC and the BB-IC are IC elements 12 disposed on the front face of the multilayer substrate 20.

In FIG. 3A, the XTAL is common to the RF-IC and the BB-IC. In the RF-IC, a signal processing section of the RF circuit (signal processing) and an adjusting section of the crystal-oscillator circuit (adjusting) are integrated. In the BB-IC, another adjusting section of the crystal-oscillator circuit is integrated. The crystal-oscillator circuit is constituted by the XTAL, the adjusting section, and the fixed capacitor (the inner capacitor 30). The fixed capacitor is arranged inside the multilayer substrate 20 and in FIG. 3A, the fixed capacitor is omitted but arranged between the adjusting section and the XTAL. The XTAL and the EFPROM are disposed in cavities provided in the rear face of the multilayer substrate 20.

In this figure, the adjusting section of the crystal-oscillator circuit corresponds to area A in FIG. 4 which will be explained below. Also, the fixed capacitor corresponds to area B in FIG. 4, and the XTAL corresponds to area C in FIG. 4.

Figure 3B:
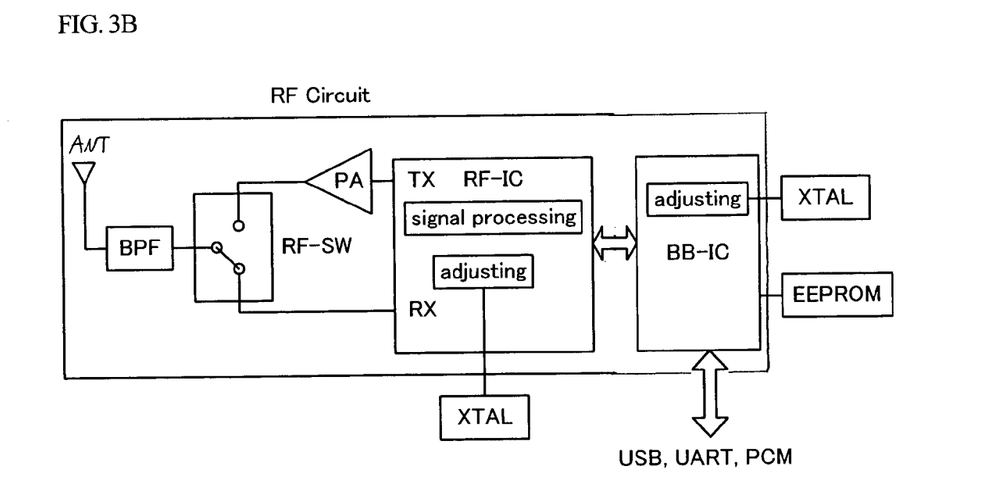

The configuration relating to the crystal-oscillator circuit is not limited to FIG. 3A. In FIG. 3B, the RF-IC and the BB-IC are provided with respective crystal-oscillator circuits each including adjusting sections and XTALS (the fixed capacitor is omitted as in FIG. 3A).

Figure 3C:
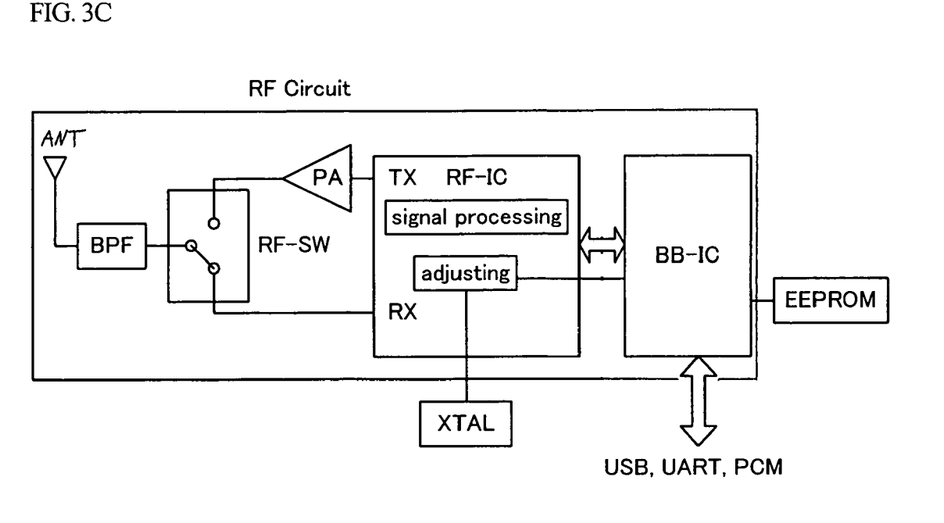

In FIG. 3C, the adjusting section is integrated in the RF-IC, and the BB-IC uses signals from the adjusting section.

Figure 3D:
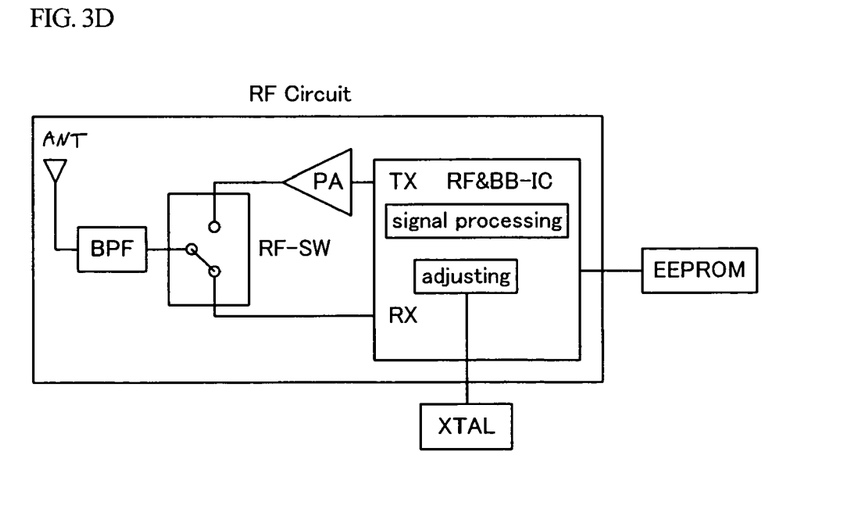

In FIG. 3D, the RF-IC and the BB-IC are integrated in a single chip (RF&BB-IC), and the adjusting section is also integrated in the chip.

Figure 4:
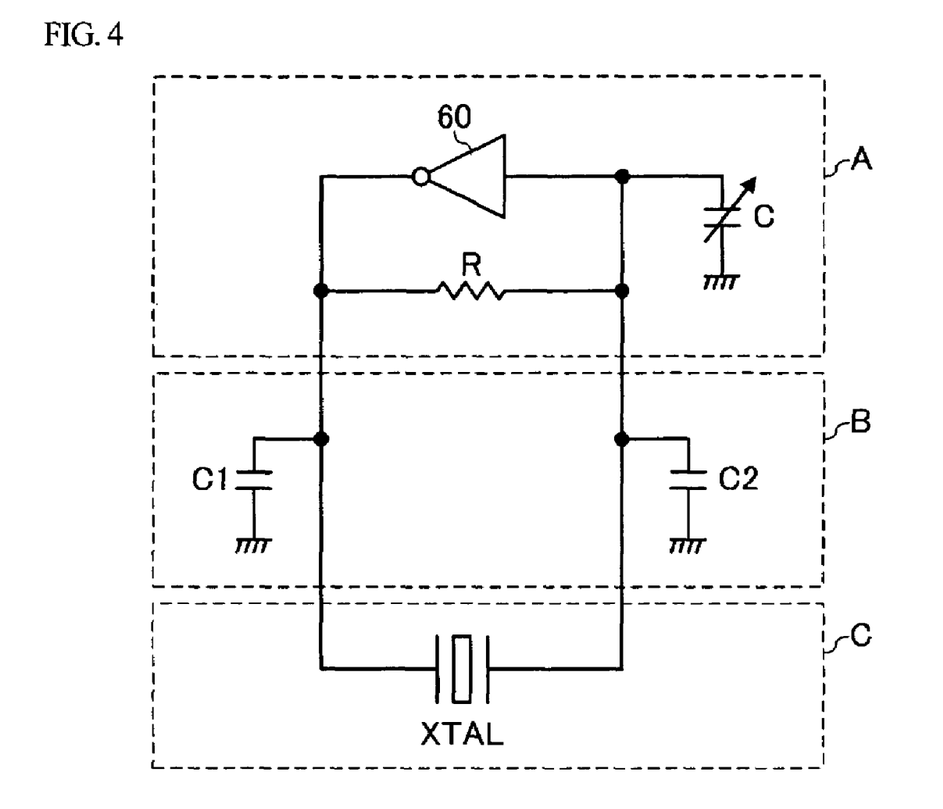
FIG. 4 is a circuit block diagram showing the structure of a crystal-oscillator circuit realized by the circuit module shown in FIG. 1.

FIG. 4 is a circuit block diagram showing the structure of a crystal-oscillator circuit realized by the circuit module shown in FIG. 1. Referring to FIG. 4, the crystal-oscillator circuit includes an amplifier circuit including an inverting amplifier 60 and a resistor R, a feedback circuit including a variable capacitor C and fixed capacitors C1 and C2, and the crystal oscillator XTAL disposed in the feedback circuit.

Here, when a power supply is applied to the crystal-oscillator circuit and a signal is input to the inverting amplifier 60, a resonance signal with which the crystal oscillator XTAL resonates at a predetermined frequency included in the signal input to the inverting amplifier 60 is generated. The resonance signal is re-input to the inverting amplifier 60 via the feedback circuit, and generates an oscillating signal at a predetermined frequency by repetition of feedback and resonance.

The oscillating frequency of the crystal-oscillator circuit is determined in accordance with the combined capacitance of the variable capacitor C and the fixed capacitors C1 and C2 that constitute the feedback circuit. Adjusting the capacitance of the variable capacitor C controls the oscillating frequency. Since the structure and operation of the crystal-oscillator circuit are described in Japanese Unexamined Patent Application Publication No. 7-99411, they are not described in this specification.

In the crystal-oscillator circuit according to the first embodiment of the present invention, an area A in FIG. 4, that is, the inverting amplifier 60, the variable capacitor C, and the resistor R, is integrated in the IC element 12 shown in FIG. 1, an area B in FIG. 4, that is, the fixed capacitors C1 and C2, is disposed inside the multilayer substrate 20 shown in FIG. 1, and an area C in FIG. 4, that is, the crystal oscillator XTAL, is disposed inside the cavity 22 shown in FIG. 1.

Figure 5:
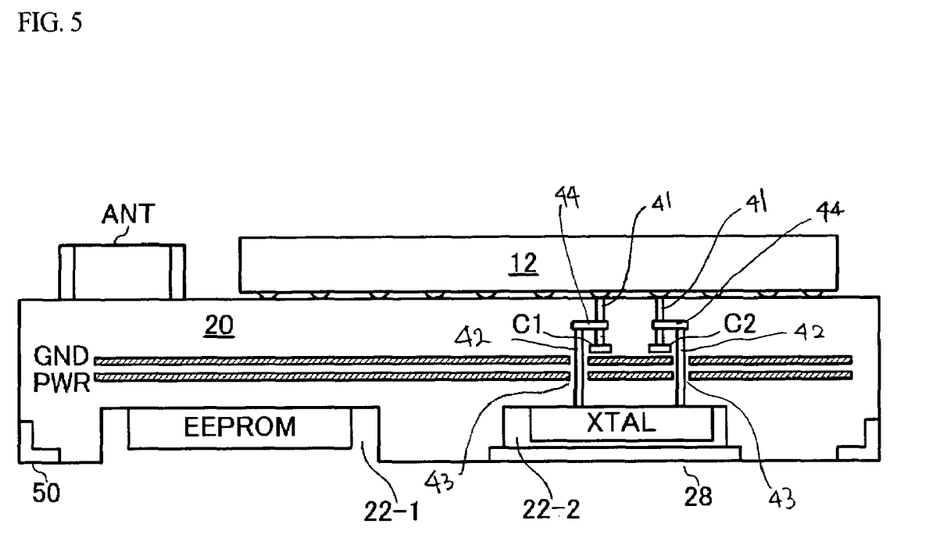
FIG. 5 is a cross-sectional view showing the structure of an RF circuit module according to a second embodiment of the present invention.

FIG. 5 is a cross-sectional view of an RF circuit module according to a second embodiment of the present invention. The circuit module according to the second embodiment shown in FIG. 5 includes an EEPROM disposed on the rear face of the multilayer substrate 20, in addition to the IC element 12 and the crystal oscillator 23 shown in FIG. 1.

In this circuit module, the antenna ANT and the IC element 12 are mounted on the front face of the multilayer substrate 20. The passive elements, such as the filter and the inductor, mounted as components in FIG. 1 and the inverting amplifier 60, the variable capacitor C, and the resistor R that constitute the crystal-oscillator circuit shown in FIG. 4 are integrated in the IC element 12.

In the multilayer substrate 20, the fixed capacitors C1 and C2 of the crystal-oscillator circuit shown in FIG. 4 are formed so as to contact corresponding independent via holes 41, 42, and to constitute ground type capacitors using an inner ground electrode GND. Each of the via holes 41, 42 connected to the fixed capacitors C1 and C2 functions as a connection line between the IC element 12 and the crystal oscillator XTAL.

An inner power electrode PWR is disposed on a layer below the inner ground electrode GND, and the power supply line and the GND line run parallel to each other. A slit 43 having a predetermined shape is provided in an area of the inner ground electrode GND and the inner power electrode PWR in which each of the via holes 41, 42 connecting the IC element 12 and the crystal oscillator XTAL is arranged, so that contact with each of the via holes 41, 42 is prevented. The via holes 41, 42 are connected each other via a wiring layer 44.

A first cavity 22-1 for accommodating the EEPROM and a second cavity 22-2 for accommodating the crystal oscillator XTAL are provided in the rear face of the multilayer substrate 20. The sealing cap 28 for sealing the crystal oscillator XTAL is disposed in the second cavity. The crystal oscillator XTAL includes the crystal strip 24, as in the first embodiment shown in FIG. 1.

According to the present invention, miniaturization of an RF circuit module including a crystal-oscillator circuit can be realized. Thus, the present invention is applicable to mobile communication apparatuses, such as cellular phones and mobile apparatuses, for which further miniaturization is desired.

The present application claims priority to Japanese Patent Application No. 2004-135745, filed Apr. 30, 2004, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:
1. A radio-frequency circuit module comprising:
a multilayer substrate having a front face and a rear face;
a radio-frequency (RF) circuit, part of which is constituted by a radio-frequency integrated circuit disposed on the front face of the multilayer substrate; and a crystal-oscillator circuit, part of which is constituted by a crystal oscillator disposed in a cavity provided in the rear face of the multilayer substrate,
wherein the crystal oscillator is disposed in a first cavity provided in the rear face of the multilayer substrate, said radio-frequency circuit module further comprising a memory circuit which is constituted by a memory element disposed in a second cavity provided in the rear face of the multilayer substrate, wherein the RF circuit comprises a signal processing section, and the crystal-oscillator circuit comprises an adjusting section, said signal processing section and said adjusting section being integrated in a radio-frequency integrated circuit (RF-IC) disposed on the front face of the multilayer substrate.

2. The radio-frequency circuit module according to claim 1, wherein the crystal-oscillator circuit comprises an oscillation semiconductor including a complementary metal-oxide semiconductor (C-MOS) inverter, a crystal oscillator, and a capacitor for determining an oscillating frequency.

3. A radio-frequency circuit module comprising:
a multilayer substrate having a front face and a rear face;
a radio-frequency (RF) circuit, part of which is constituted by a radio-frequency integrated circuit disposed on the front face of the multilayer substrate; and
a crystal-oscillator circuit, part of which is constituted by a crystal oscillator disposed in a cavity provided in the rear face of the multilayer substrate,
wherein:
the crystal-oscillator circuit includes a crystal oscillator, an inverting amplifier, a variable capacitor, and a fixed capacitor;
the variable capacitor and the fixed capacitor constitute a feedback circuit;
the inverting amplifier and the variable capacitor are integrated in a circuit element disposed on the front face of the multilayer substrate;
the fixed capacitor is disposed inside the multilayer substrate; and
the crystal oscillator is disposed in a cavity provided in the rear face of the multilayer substrate.

4. The radio-frequency circuit module according to claim 3, wherein the radio-frequency circuit comprises an RF front end part and a baseband part that constitute a radio communication circuit.

5. The radio-frequency circuit module according to claim 3, wherein an RF IC in which part of the radio-frequency circuit is integrated is mounted on the front face of the multilayer substrate.

6. The radio-frequency circuit module according to claim 5, wherein an RF IC in which the RF front end part and the baseband part are integrated is mounted on the front face of the multilayer substrate.

7. The radio-frequency circuit module according to claim 3, wherein a circuit for Bluetooth is arranged as the RF circuit.

8. The radio-frequency circuit module according to claim 3, wherein a circuit for a wireless LAN is arranged as the RF circuit.

9. The radio-frequency circuit module according to claim 3, wherein the crystal-oscillator circuit is used as a reference oscillator of the RF circuit.

10. The radio-frequency circuit module according to claim 3, wherein the crystal-oscillator circuit generates a clock signal at a predetermined frequency by a resonant operation of the crystal oscillator, and inputs the clock signal to the RF circuit.

11. The radio-frequency circuit module according to claim 3, wherein the multilayer substrate is an element for realizing part of the wiring in the RF circuit, part of the wiring in the crystal-oscillator circuit, or a connection between the RF circuit and the crystal-oscillator circuit.

12. The radio-frequency circuit module according to claim 3, wherein the multilayer substrate is ceramic or resin.

13. The radio-frequency circuit module according to claim 3, wherein a cavity having a predetermined shape is provided in the rear face of the multilayer substrate, wherein the crystal oscillator is accommodated in the cavity.

14. The radio-frequency circuit module according to claim 3, wherein the signal processing section of the RF circuit is a circuit block that performs signal processing using a clock signal generated by the crystal-oscillator circuit.

15. The radio-frequency circuit module according to claim 3, further comprising:
a conductive sealing cap exposed on the rear face of the multilayer substrate, the sealing cap sealing the cavity; and
an external terminal exposed on the same face as the face on which the sealing cap is exposed.

16. A radio communication apparatus comprising:
a motherboard;
a radio-frequency circuit module mounted on the motherboard, said radio-frequency circuit module comprising:
a multilayer substrate having a front face and a rear face;
a radio-frequency (RF) circuit, part of which is constituted by a radio-frequency integrated circuit disposed on the front face of the multilayer substrate;
a crystal-oscillator circuit, part of which is constituted by a crystal oscillator disposed in a cavity provided in the rear face of the multilayer substrate;
a conductive sealing cap exposed on the rear face of the multilayer substrate, the sealing cap sealing the cavity; and
an external terminal exposed on the same face as the face on which the sealing cap is exposed,
wherein:
the radio-frequency circuit module is mounted on the motherboard with the sealing cap and the external terminal therebetween; and
the radio-frequency circuit module is electrically connected inside the motherboard with at least the external terminal therebetween.

17. The radio-frequency circuit module according to claim 16, wherein the RF circuit comprises a signal processing section, and the crystal-oscillator circuit comprises an adjusting section, said signal processing section and said adjusting section being integrated in a radio-frequency integrated circuit (RF-IC) disposed on the front face of the multilayer substrate.

18. The radio-frequency circuit module according to claim 17, wherein the crystal-oscillator circuit comprises an inverting amplifier which is integrated into the RF-IC.

* * * * *